US005565659A

United States Patent [19]

Moner, Jr. et al.

[11] Patent Number: 5,565,659

[45] Date of Patent: Oct. 15, 1996

[54] SPEAKER COVER GRILLE

[75] Inventors: Bernard T. Moner, Jr., Wayne; David T. Mulera, Ann Arbor, both of Mich.

[73] Assignee: Oakwood Metal Fabricating Company, Dearborn, Mich.

[21] Appl. No.: 355,951

[22] Filed: Feb. 27, 1995

[51] Int. Cl.[6] ........ H05K 5/00

[52] U.S. Cl. ........ 181/150; 181/141

[58] Field of Search ........ 181/148, 150, 181/141; 381/188, 205

[56] References Cited

U.S. PATENT DOCUMENTS

| | | | |
|---|---|---|---|
| 4,934,480 | 6/1990 | Gaté et al. | 181/150 |
| 4,974,698 | 12/1990 | Smith | 181/150 |
| 5,113,968 | 5/1992 | Lemmon | 181/150 X |
| 5,416,283 | 5/1995 | Dault et al. | 181/150 |

*Primary Examiner*—Khanh Dang

*Attorney, Agent, or Firm*—John R. Benefiel

[57] ABSTRACT

A pierced metal speaker cover grille has a series of tabs extending rearwardly away from the turned edge of a front portion, pairs of angled ears formed on each tab, one on each side thereof. The ears cam the tab as it is advanced into an aligned slot in the mounting panel, and lock behind the rear edge to secure the cover grille in place.

4 Claims, 2 Drawing Sheets

SPEAKER COVER GRILLE

FIELD OF THE INVENTION

This invention concerns speaker cover grilles for automotive interior trim applications.

BACKGROUND OF THE INVENTION

A speaker grille construction involving a pierced metal panel has been heretofore described in U.S. Pat. No. 4,974,698 issued to the assignee of the present patent application on Dec. 4, 1990 for a "Speaker Cover Grille Installation".

As described in that patent, an expanded or perforated pierced metal cover panel has aesthetic appeal over plastic or cloth cover material and allows better sound transmission.

However, since the pierced metal cover must be constructed of mild sheet steel, conventional installation required either separate fasteners or solid spring steel tabs, or a plastic frame, substantially increasing costs.

U.S. Pat. No. 4,974,698 describes an advantageous integral tab geometry formed into the pierced metal material itself which allows snap fitting of the cover to a trim panel without the use of spring steel tabs or separate fasteners.

The object of the present invention is to provide another form of the snap-fitted cover edge shown in U.S. Pat. No. 4,974,698 which will provide a secure snap fitting assembly of the cover to the inner periphery of a trim panel defining the speaker opening.

SUMMARY OF THE INVENTION

This and other objects of the present invention which will be appreciated by a reading of the following specification and claims are achieved by a speaker cover grille having a series of tabs distributed about the perimeter of the pierced metal speaker cover grille, which are integrally formed from the pierced metal material.

The tabs extend rearwardly from the formed over rim and are each provided with a pair of radially outwardly projecting ears. The ears each have an angled entry side edge which create a cam action deflecting the tabs as they are inserted into a respective one of a series of slots in the speaker housing, each aligned with a respective tab.

The return side edge behind each angled entry side locks behind the trim piece thickness adjacent the associated slot to secure the cover grille in place.

The return side edges may also be angled to facilitate removal of the cover grille.

DETAILED DESCRIPTION

In the following detailed description, certain specific terminology will be employed for the sake of clarity and a particular embodiment described in accordance with the requirements of 35 USC 112, but it is to be understood that the same is not intended to be limiting and should not be so construed inasmuch as the invention is capable of taking many forms and variations within the scope of the appended claims.

Figure 1:
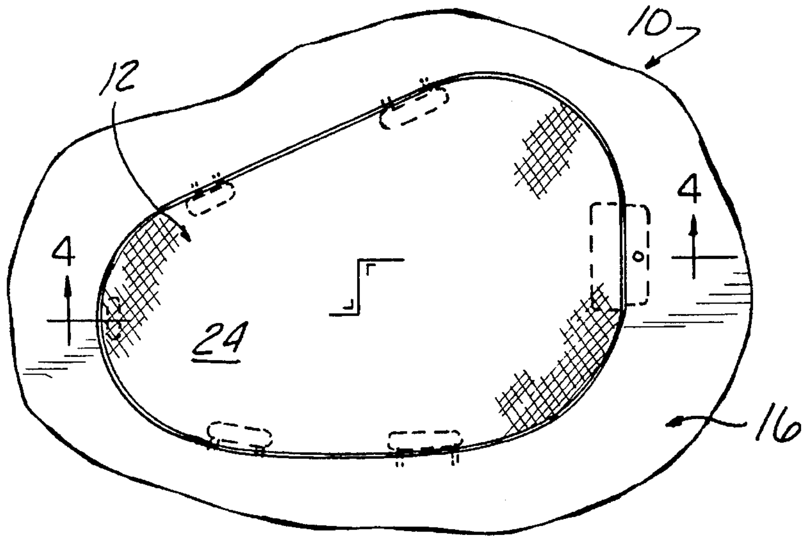
FIG. 1 is a plan view of a speaker grille installation according to the inventor with the adjacent trim piece portions shown in fragmentary form.
Figure 2:
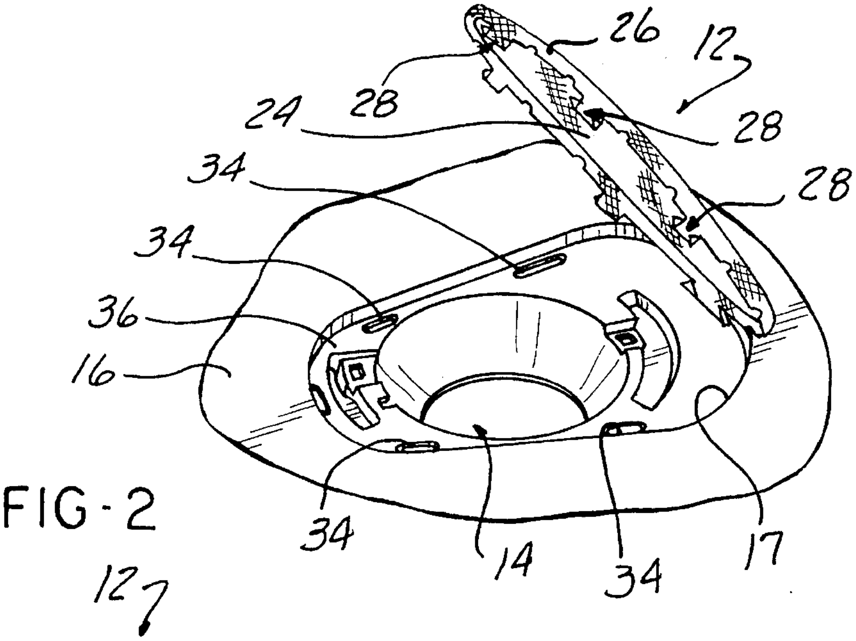
FIG. 2 is a perspective view of the speaker grille shown in FIG. 1 partially assembled to the trim piece, shown in fragmentary form.
Figure 4:
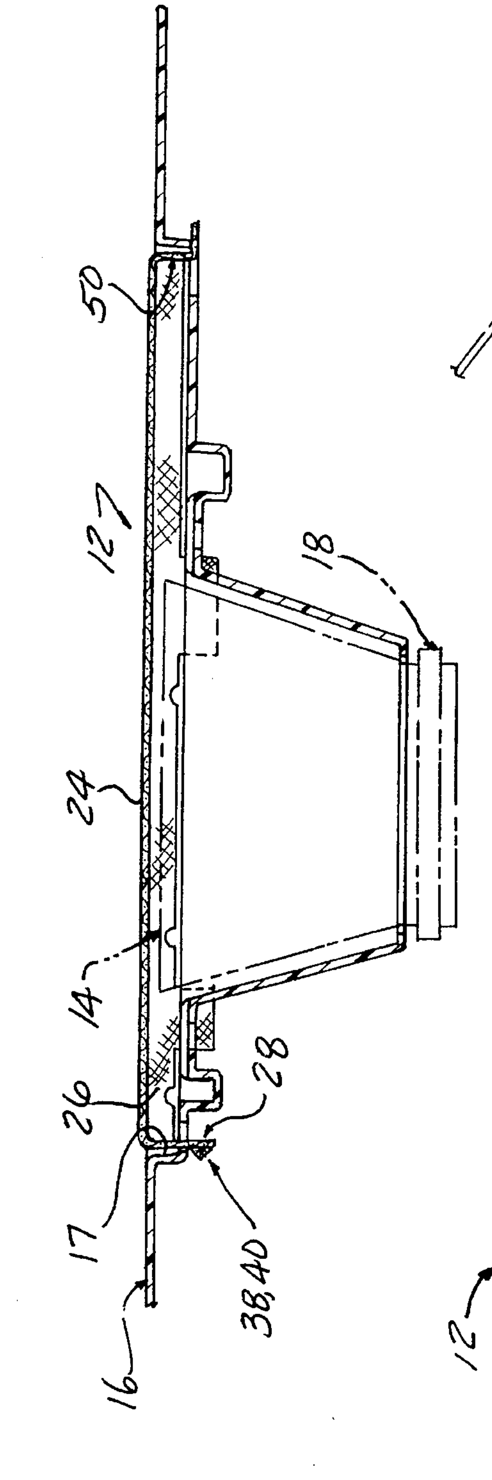
FIG. 4 is a view of the transverse section through the speaker grille installation shown in FIG. 1 taken along the line 4—4.

Referring to the drawings, and particularly FIGS. 1, 2 and 4, a speaker cover grille installation 10 is shown, in which a formed metal cover grille 12 is secured over a speaker opening 14 forming a trim piece, here comprised of a door panel 16. A speaker assembly 18 is mounted so as to allow sound waves to emanate through the speaker housing opening 14 and the holes through the speaker cover grille 12.

The speaker cover grille 12 is formed of sheet metal material which has been pierced as by being perforated by or expanded by a punching or forming operation to form a pattern of openings extending completely across the area of the cover grille 12. An open area defined by the pierced holes is thus provided, allowing the transmission of sound therethrough. Cold rolled low carbon sheet steel is required to allow the formation of openings therein since spring steel cannot easily be formed with small diameter holes. For minimum distortion, 40–50% open area should be provided, 43% having been found to be optimal for transmitting the speaker sounds therethrough.

The cover grill 12 is comprised of a generally planar main area 24 having a turned edge 26 extending around the perimeter thereof presenting a smooth, substantial appearance. The trim piece 16 is formed with a recess 17 defining the speaker opening 14 into which is interfit the turned edge 26 of the speaker cover grille 12 which has a terminus 42 abutting a surface 36 defined by the recess 17 when the speaker cover grille 12 is installed therein.

According to the concept of the present invention, one or more integral tabs 28 are distributed in a series along the turned edge 26, with a single locating hinge tab 50 also provided integral with the turned edge 26. Each tab 28 comprises a rearward extension of the turned edge 24.

Each tab 28 includes an inwardly extending planar extension section 32 being generally perpendicular to the central section 26 so as to extend inwardly beyond the turned edge 26 so as to pass through a respective one of a series of slots 34 formed in a planar surface 36 of the trim piece 16 against which the turned edge 26 abuts.

Each tab 28 is formed with a pair of triangularly shaped ears 38, comprised of integral portions folded outwardly from respective side of the tab to project radially from the planar portion 32.

The tabs 28 are each able to undergo considerable deflection inwardly while remaining within the yieldable limits of the cover material by the presence of the planar extension section 32, which length adds to the length of the section holding the ears 38, 40.

The locating tab 30 is initially seated in one of the slots 34 at installation, and the cover grille 12 hinged thereabout to bring the tabs 28 into respective engagement with the remaining slots 34.

The locating tab 30 thus serves to correctly position the cover grille 12 to be aligned over the opening 14 for proper engagement of the tabs 28.

At least one tab 28 is provided opposite a single locating tab 30. Additional gripper tabs 28 are formed distributed in a series about the cover perimeter to increase the retention force acting on the installed cover grille 12.

Since the tabs 28 and 30 are integrally formed of the material of the cover grille 12, the proper deflection resistance will depend on the bendability of that material. It is important to avoid bending beyond the yield point of the material to insure adequate retention forces. The bendability of perforate or expanded sheet metal .material will of course depend on its thickness and the geometry of the hole pattern.

Figure 3:
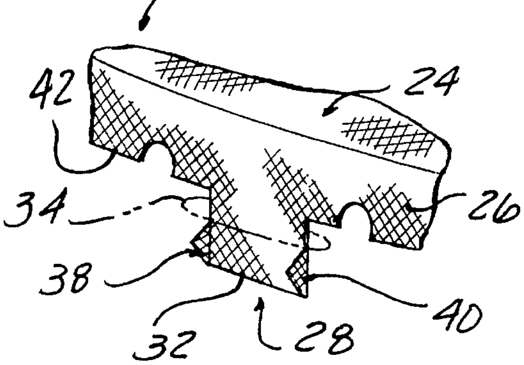
FIG. 3 is an enlarged fragmentary portion of the speaker grille shown in FIGS. 1 and 2, showing the details of a latching tabs and indicating the mating slot in phantom lines.

The ears 38 and 40 are spaced below the terminus 42 of the turned edge 26 (FIG. 3) a distance on the planar section 32 so as to allow the ears 38, 40 to pass through the respective slot 34.

Figure 3A:
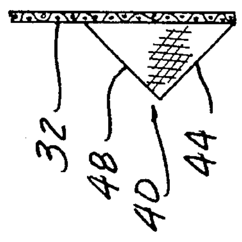
FIG. 3A is a side elevational enlarged view of a tab ear portion showing the angled entrant and return side edges for installation and removal.

Each ear 38, 40 is formed with an inclined entry side edge 44 (FIG. 3A) which projects radially sufficiently to engage the side of the slot 34 as the speaker grille cover 12 is moved down towards the surface 36 of the trim piece 16 at assembly.

Figure 5:
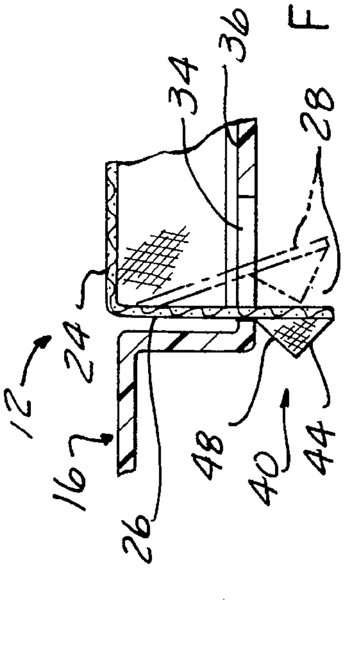
FIG. 5 is an enlarged fragmentary view of the latching tab showing the tab ear engagement with the slot perimeter edge.
Figure 6:
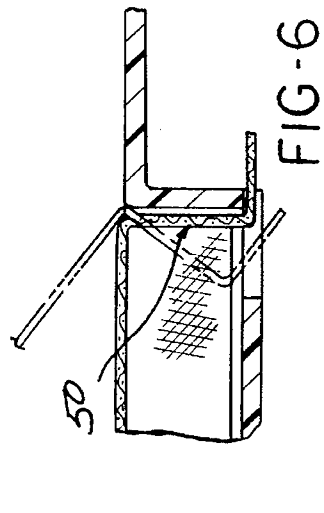
FIG. 6 is an enlarged fragmentary view of a locating tab and its engagement with the trim piece.

As shown in FIG. 5, the upward inclination of the entry side edge causes a camming action radially deflecting the planar extension portion 32 of the associated tab 28 as the ears 38, 40 move past the outer edge of the slot 34. As the ears 38, 40 move past the thickness of the trim piece material defining the slot 34, the tab planar portion 32 can again straighten, causing return side edge 48 on each ear to engage the slot edge. The abutment of the terminus 42 results in a gripping of the trim piece material by the ear return side edge 48 engagement.

Thus, a secure mounting of the cover grille 12 to the trim piece 16 is achieved.

The length of the tabs 28 should be sufficient so that a relatively slight local deflection occurs along its length to avoid substantial yielding of the mild steel material.

The speaker cover grille 12 is nested into the recess 17 of the trim piece 16.

The return side edge 48 is preferably also angled to assist in disassembly and to insure latching engagement with the edge of the slot 34.

Figure 3B:
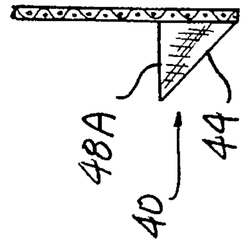
FIG. 3B is a side elevational enlarged view of a modified form of the ear portion of a latching tab.

However, as shown in FIG. 3B, the return side edge 48A may be only slightly angled or not angled at all.

We claim:

1. A speaker cover grille assembly for covering an opening in a trim piece behind which a speaker assembly is adapted to be mounted, said cover grille assembly comprising:

a cover grille comprised of a formed sheet of pierced sheet metal completely covered with a pattern of through holes to create an open area allowing transmission of sound therethrough, said cover grille having a central generally planar main front portion and an integral formed turned edge extending rearwardly about a perimeter of said generally planar main front portion;

said cover grille having at least one generally planar tab integrally formed from said formed turned edge of pierced metal, said tab extending away from said formed edge in a direction generally normal to said central generally planar portion, and having a pair of sides, an integral portion folded outwardly from each of said sides of said at least one tab, each outwardly folded portion having a lower edge inclined upwardly towards said central main portion of said cover grille and extending from a location adjacent an outboard end of said tab;

said trim piece formed with a surface adjacent said opening, which said turned edged of said speaker cover grille abuts, and also formed with at least one slot allowing said at least one tab to move past said surface, and an edge of said trim piece slot engaged by said upwardly inclined lower edge of said outwardly folded portions of said tab to cause said tab to be cammed inwardly as said turned edge of said cover grille moves towards abutment with said trim piece surface;

said outwardly folded portion having an upper edge engaging said trim piece on a surface located past said slot to retain said cover grille installed over said trim piece opening after said tab is inserted in said slot.

2. The assembly according to claim 1 wherein said outwardly folded portions of said tab comprise triangularly shaped ears folded outwardly from each side of said tab.

3. The assembly according to claim 2 wherein one side of each of said ears comprises said lower edge engaging said trim piece slot's edge and said upper edge comprises a second side of said triangularly shaped ear.

4. A speaker cover grille comprising:

a sheet of pierced metal formed with a pattern of openings creating an open area to allow transmission of sound therethrough, said pattern substantially covering a full extent of said cover grille, said cover grille having a generally planar central front portion and an inwardly turned edge about a perimeter thereof;

a series of tabs integrally formed to extend from said inwardly turned edge at spaced points along said turned edge;

said tabs including an integral planar extension extending rearwardly from said turned edge generally normally to said central portion;

said tabs each formed with a pair of integral triangularly shaped ears folded out from a respective side of each of said tabs normally to said tab main portion and said speaker cover grille central portion.

* * * * *

UNITED STATES PATENT AND TRADEMARK OFFICE

CERTIFICATE OF CORRECTION

PATENT NO. : 5,565,659

DATED : October 15, 1996

INVENTOR(S) : Bernard T. Moner, Jr. et al

It is certified that error appears in the above-indentified patent and that said Letters Patent is hereby corrected as shown below:

Abstract, line 2, delete "rearwardly".

Abstract, line 2, after "front" insert --cover--.

Column 2, line 51, delete "24" and insert --26--.

Column 2, line 54, delete "26" and insert --24--.

Column 2, line 59, after "38," insert --40--.

Column 2, line 60, after "radially" insert --outwardly--.

Column 3, line 29, after "of the" insert --lower or--.

Column 3, line 35, after "causing" insert --an upper--.

Signed and Sealed this

Fourteenth Day of January, 1997

*Attest:*

BRUCE LEHMAN

*Attesting Officer* *Commissioner of Patents and Trademarks*